United States Patent
Müller et al.

(10) Patent No.: US 10,830,820 B2
(45) Date of Patent: Nov. 10, 2020

(54) SWITCH CIRCUIT, METHOD FOR OPERATING A SWITCH CIRCUIT AND AN AUTOMATED TEST EQUIPMENT

(71) Applicant: Advantest Corporation, Tokyo (JP)

(72) Inventors: Detlef Müller, Renningen (DE); Markus Rottacker, Stuttgart (DE); Bernhard Mayer, Grafenau (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 15/793,939

(22) Filed: Oct. 25, 2017

(65) Prior Publication Data

US 2018/0045782 A1 Feb. 15, 2018

Related U.S. Application Data

(63) Continuation of application No. PCT/EP2015/059107, filed on Apr. 27, 2015.

(51) Int. Cl.
| | |
|---|---|
| *G01R 31/327* | (2006.01) |
| *H01H 1/00* | (2006.01) |
| *H01H 9/54* | (2006.01) |
| *H03K 17/0814* | (2006.01) |
| *H03K 17/0812* | (2006.01) |
| *H01H 50/00* | (2006.01) |

(52) U.S. Cl.
CPC ......... *G01R 31/327* (2013.01); *H01H 1/0036* (2013.01); *H01H 9/547* (2013.01); *H01H 9/548* (2013.01); *H01H 50/005* (2013.01); *H03K 17/0812* (2013.01); *H03K 17/0814* (2013.01); *H03K 2217/0054* (2013.01)

(58) Field of Classification Search
CPC ....... G01R 31/327; H01H 9/547; H01H 9/548
See application file for complete search history.

(56) References Cited

U.S. PATENT DOCUMENTS

| | | |
|---|---|---|
| 6,292,415 B1 | 9/2001 | Brehm |
| 6,327,545 B1 | 12/2001 | Browen et al. |
| 6,397,160 B1 | 5/2002 | Craig et al. |
| 6,452,411 B1 | 9/2002 | Miller et al. |
| 6,480,978 B1 | 11/2002 | Roy et al. |
| 6,795,496 B1 | 9/2004 | Soma et al. |
| 6,982,903 B2 | 1/2006 | Bertin et al. |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

(Continued)

*Primary Examiner* — Alvaro E Fortich

(57) ABSTRACT

A switch circuit includes at least a first and a second switch element connected in series and a switch control configured for providing control signals for switching the first and the second switch element, such that the control signals have a different timing and such that the first and the second switch element perform one joint switch function.

19 Claims, 4 Drawing Sheets

(56) References Cited

U.S. PATENT DOCUMENTS

| | | |
|---|---|---|
| 7,256,585 B1 | 8/2007 | Shoulders |
| 7,385,445 B2 | 6/2008 | Wright |
| 7,495,952 B2 | 2/2009 | Lal et al. |
| 7,737,810 B2 | 6/2010 | Chan et al. |
| 9,423,440 B2* | 8/2016 | Pausini ............ G01R 31/31709 |
| 2003/0156545 A1* | 8/2003 | Shimanouchi ..... G01R 31/2844 370/241 |
| 2004/0004466 A1 | 1/2004 | Miyanaga et al. |
| 2005/0050546 A1 | 3/2005 | Remany et al. |
| 2005/0068068 A1 | 3/2005 | Hall |
| 2005/0229064 A1* | 10/2005 | Guidry ................. G01R 31/319 714/742 |
| 2005/0234662 A1 | 10/2005 | Niedzwiecki et al. |
| 2008/0143399 A1* | 6/2008 | Suda ...................... H03L 7/0814 327/156 |
| 2009/0092177 A1 | 4/2009 | Dvorak et al. |
| 2009/0102540 A1* | 4/2009 | Iida ................... H03K 17/04206 327/427 |
| 2009/0129129 A1 | 5/2009 | Udagawa |
| 2009/0240365 A1 | 9/2009 | Nijima et al. |
| 2009/0272634 A1* | 11/2009 | Ehlers ................. H01H 59/0009 200/181 |
| 2010/0157707 A1* | 6/2010 | Dudeck ................ G11C 29/026 365/205 |
| 2010/0213960 A1* | 8/2010 | Mok .................. G01R 31/2889 324/762.03 |
| 2010/0213966 A1* | 8/2010 | Kojima ............ G01R 31/31932 324/750.3 |
| 2010/0225301 A1 | 9/2010 | Nakayama et al. |
| 2010/0228515 A1 | 9/2010 | Srinivasan et al. |
| 2010/0309952 A1 | 12/2010 | Asami |
| 2010/0312506 A1 | 12/2010 | Taylor |
| 2011/0121904 A1* | 5/2011 | Kojima ............ G01R 19/16576 330/284 |
| 2011/0131000 A1 | 6/2011 | Daub et al. |
| 2011/0227767 A1 | 9/2011 | O'Brien |
| 2012/0049655 A1 | 3/2012 | Leyendecker et al. |
| 2012/0221279 A1 | 8/2012 | Zhang |
| 2013/0006567 A1 | 1/2013 | Horn |
| 2013/0229068 A1* | 9/2013 | Sanders, III ......... H01H 47/002 307/115 |
| 2013/0234723 A1 | 9/2013 | Behrens et al. |
| 2014/0103907 A1* | 4/2014 | Muecke ............... G01R 35/005 324/130 |
| 2015/0137840 A1* | 5/2015 | Whittington ............ H02M 1/00 324/750.01 |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

* cited by examiner

400

Providing control signals for switching the first and the second switch element, such that the control signals comprise a different timing and such that the first and the second switch element perform one joint switch function — 405

FIG 4

SWITCH CIRCUIT, METHOD FOR OPERATING A SWITCH CIRCUIT AND AN AUTOMATED TEST EQUIPMENT

CROSS-REFERENCE TO RELATED APPLICATIONS

This application is a continuation of copending International Application No. PCT/EP2015/059107, filed Apr. 27, 2015, which is incorporated herein by reference in its entirety.

Embodiments of the present invention relate to a switch circuit, a method for operating a switch circuit and an automated test equipment. Further embodiments relate to a switch capability extension for MEMS protection.

BACKGROUND OF THE INVENTION

An ATE (automatic test equipment) environment for semiconductor test uses a very large number of analog signal switch elements in a very small form factor. In addition, a very high switching cycle counts and a high level of reliability is advantageous. The industry offers different solutions to address this market:
  Classical mechanical and Reed Relays
  MEMS switches
  Photo MOS switches
  FET Switches
  Semiconductor switches Each of the technologies has its strengths and weaknesses for certain applications, but there is no one-size fit for everything. The idea presented in this document tries to take advantage by combining two or more switches to mitigate problems or to overcome the limitations imposed by the properties of a particular technology.

Mechanical Reed Relays have been used for signal paths switching inside of measurement equipment for many years. These mechanical relays are slow and tend to break down relatively fast. Using MEMS devices can improve the switching speed and number of switching cycles in this application.

However, MEMS devices have a very limited lifetime if they are used in applications which may use switching of signals with a significant voltage amplitude into a low impedance load (e.g., into 50 Ω). The problem becomes even worse if the switched signal has a DC component.

SUMMARY

According to an embodiment, a switch circuit may have: at least a first and a second switch element connected in series; a switch control configured for providing control signals for switching the first and the second switch element, such that the control signals have a different timing and such that the first and the second switch element perform one joint switch function.

According to another embodiment, a switch circuit may have: at least a first and a second switch element, wherein the second switch element is of a different type when compared to the first switch element, wherein the second switch element is connected in series to the first switch element; a switch control configured for providing control signals for the first and the second switch, such that the first and the second switch perform one joint switch function.

According to another embodiment, an automated test equipment may have: a signal path between a device under test connection and an instrument; and an inventive switch element, wherein the switch element is included in the signal path.

According to another embodiment, a method for operating a switch circuit having a first switch element and a second switch element which are connected in series may have the step of: providing control signals for switching the first and the second switch element, such that the control signals have a different timing and such that the first and the second switch element perform one joint switch function.

Another embodiment may have a non transitory digital storage medium having a computer program stored thereon to perform the method for operating a switch circuit having a first switch element and a second switch element which are connected in series, the method having the step of: providing control signals for switching the first and the second switch element, such that the control signals have a different timing and such that the first and the second switch element perform one joint switch function, when said computer program is run by a computer.

According to a first embodiment, a switch circuit comprises at least a first and a second switch element connected in series, and a switch control for providing control signals for switching the first and the second switch elements, such that the control signals comprise a different timing and such that the first and the second switch element perform one joint switch function. The second switch element may be of a different type when compared to the first switch element.

Teachings disclosed herein are based on the fundamental idea that combining two switches can perceive the advantages of both switches and to overcome their disadvantages. For example, a MEMS switch which has a high DC isolation is vulnerable for a multiple hot-switching operation. Furthermore, e.g. a photo MOS switch is robust against multiple hot-switching, and comprises a strongly temperature dependent leakage effect. A combination of both switches using a common switch controller leads to a joint switch function being robust against multiple hot-switching and having very low leakage.

Embodiments show a switch circuit comprising at least a first and a second switch element of a different type when compared to the first switch element, wherein the second switch element is connected in series to the first switch element. Additionally, the switch circuit comprises a switch control configured for providing control signals for the first and the second switch, such that the first and the second switch perform one joint switch function. Therefore, the control signals comprise a different timing to perform the joint switching operation. Performing a joint switch function using two distinct switches is advantageous, since one of the switches can protect the other switch against harmful treatments, e.g., due to multiple hot-switching.

According to further embodiments, the first switch element is configured for robustly hot-switching an analog signal. This may be performed by a metal oxide semiconductor (MOS) switch or, more specifically, by a photo MOS switch. This is advantageous, since the first switch element is able to toggle an analog signal multiple times, which would be potentially harmful for the second switch element.

Embodiments show the second switch comprising a better isolation when compared to the first switch. Therefore, the second switch may be a micro electro mechanical (MEMS) switch. It is advantageous, since the second switch provides a low leakage, especially a low DC leakage and therefore provides a high internal resistance, e.g., when performing measures on a device in an idle mode.

Further embodiments show the switch control switching the second switch element in an absence of an electrical current. Therefore, the switch control may switch the first switch element to control the current flow through the second switch element. To be more precise, the switch control may close the second switch prior to the first switch if the first and the second switch are open and to open the second switch after the first switch if the first and the second switch are closed. This is advantageous since the second switch can be toggled in an idle mode, i.e., without an impressed voltage.

Further embodiments show an automated test equipment comprising a signal path between a device under test connection and an instrument and further comprises an inventive switch element, wherein the switch element is included in the signal path.

BRIEF DESCRIPTION OF THE DRAWINGS

Embodiments of the present invention will be detailed subsequently referring to the appended drawings, in which:

FIG. 4 shows a schematic block diagram of a method for operating the switch circuit.

DETAILED DESCRIPTION OF THE INVENTION

Embodiments of the present invention will be discussed in detail below, wherein identical reference numbers are provided to objects having identical or similar functions, so that the description thereof is interchangeable or mutually applicable.

Without limiting the conception, the following description will focus on a specific application for an analog signal switching path.

Figure 1:
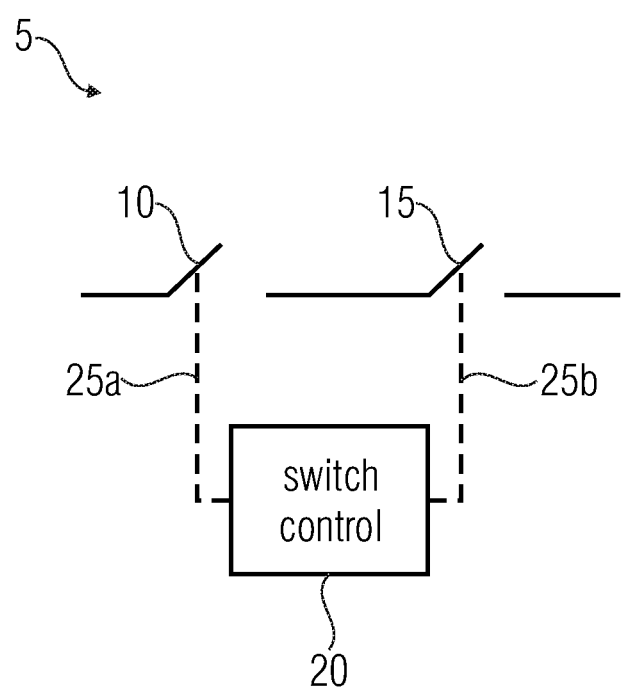
FIG. 1 shows a schematic block diagram of the switch circuit.

The example used to explain the concept is targeting an analog signal path for a mixed signal test instrument. This application shows:
 a. low leakage to allow accurate DC measurements when the switching element is off
 b. switching of a signal which has DC and AC components if the switch is closed
 c. a large number of switching cycles
 d. high level of AC isolation FIG. 1 shows a schematic block diagram of a switch circuit 5. The switch circuit 5 comprises at least a first and a second switch element 10, 15 connected in series and a switch control 20. The switch control 20 is configured to provide control signals 25a, b for switching the first and the second switch element 10, 15, such that the control signals 25a, b comprise a different timing and such that the first and the second switch element 10, 15 perform one joint switch function. A joint switch function means that, by default, the first and the second switch element 10, 15 are both open or closed. During switching (or toggling) the state of the first and the second switch element may be different. For example, if the first and the second switch are closed, the first switch 10 may open and after a current flow state, the second switch element 15 can be opened as well. The second switch element 15 may be of a different type when compared to the first switch element.

According to a further embodiment, the switch circuit 5 comprises at least a first and a second switch element 10, 15, wherein the second switch element is of a different type when compared to the first switch element 10, and wherein the second switch element is connected in series to the first switch element. Furthermore, the switch circuit 5 comprises a switch control 20 to provide control signals 25a, b for the first and the second switch 10, 15, such that the first and the second switch perform one joint switch operation. Additionally, the control signals 25a, b may comprise a different timing to perform the joint switching operation. Again, a joint switching operation means that usually the first and the second switch element 10, 15 are in the same state, i.e., both are open or closed. Only during a switching operation, the state of the first and the second switch may be different.

It was stated in the already described embodiments that the first and the second switch element 10, 15 are of a different type. A different type means that either the first or the second switch element comprises at least one technical advantage compared to the other switch element. A technical advantage may be, for example, an internal resistance, a leakage current, robustness against switching, e.g., hot-switching, or the heating of the switch element.

According to embodiments, the first switch element 10 is configured for robustly hot-switching an analog signal. Therefore, the first switch element 10 may be a metal oxide semiconductor (MOS) switch, especially a photo MOS switch. A semiconductor switching element 10 could satisfy the second requirement, i.e., the switching of a signal which has DC and AC components, if the switch is closed (i.e., hot-switching). Nonetheless, the first switch element may comprise a strongly temperature dependent leakage, which is advantageously avoided and therefore prevents the usage of such a switching element as a single switch element.

According to a further embodiment, the second switch element 16 comprises a better isolation when compared to the first switch element 10. Therefore, the second switch element 15 may he a micro electro mechanical (MEMS) switch, MEMS switches offer a high number of switching cycles, good isolation, and almost no leakage. However, MEMS switches expose problems with hot-switching if operated with large amplitude signals or significant DC offset on the switching signal. A combination of two switches, for example, with a photo MOS switch as a first switch element 10 and a MEMS switch as a second switch element 15, can satisfy the complete list of requirements which have been described previously.

Further embodiments are related to the switch control 20. The switch control provides the control signals 25a, b to the first switch element 10 and the second switch element 15, respectively. An exemplary switch control sequence is presented in FIG. 3. However, the switch control 20 is configured to switch the second switch element in an absence of an electrical current. Therefore, the switch control 20 may switch the first switch element to control the current flow through the second switch element 15. More specifically, the switch control 20 may close the second switch element 15 prior to the first switch element 10 if the first and the second switch elements 10, 15 are open and to open the second switch element 15 after the first switch element 10 if the first and the second switch element 10, 15 are closed.

Figure 2:
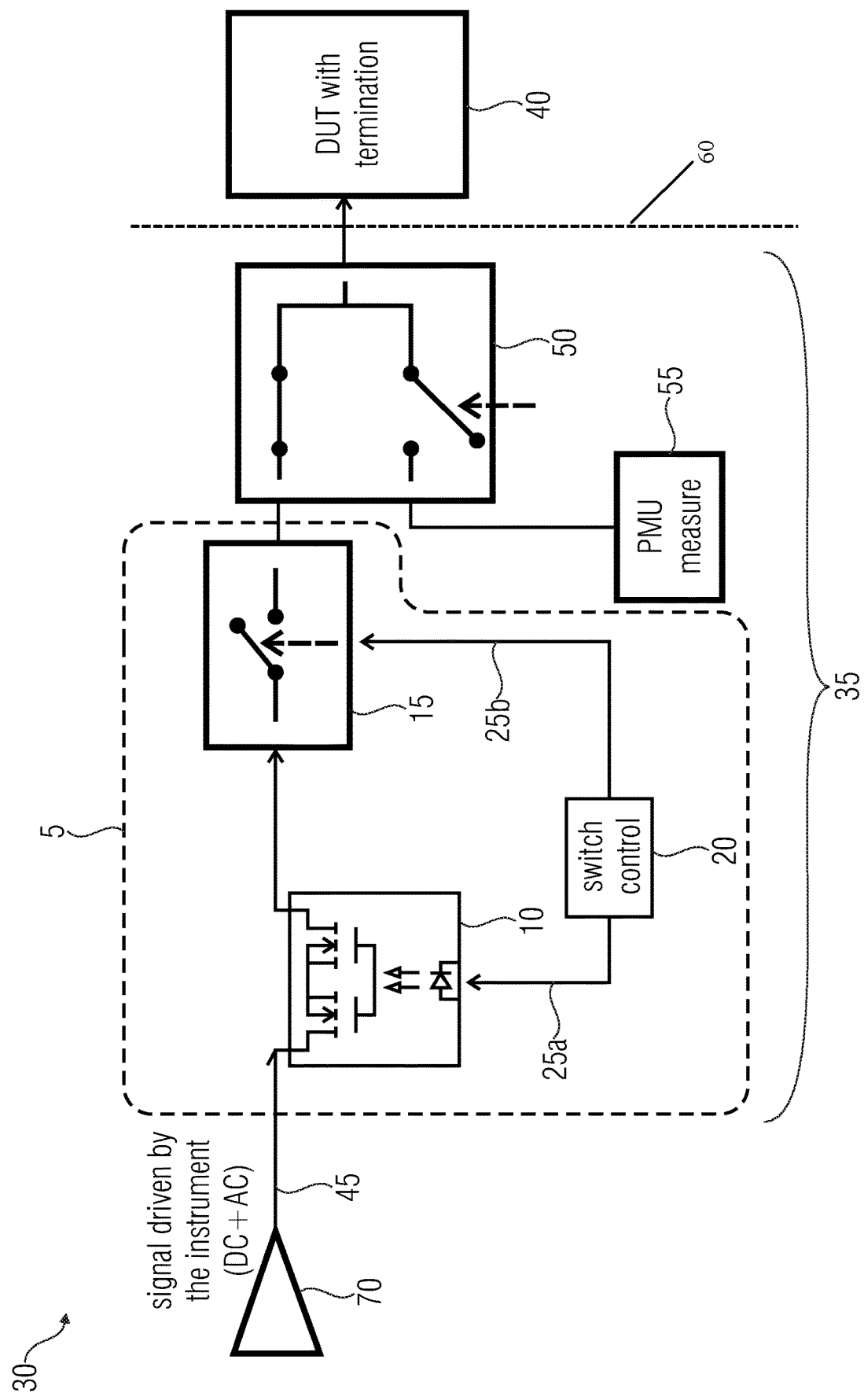
FIG. 2 shows a schematic block diagram of an automatic test equipment comprising a switch circuit.

FIG. 2 shows a schematic block diagram of an automated test equipment 30. The automated test equipment 30 comprises a signal path 35 between a device under test connection and an instrument 70. The device under test connection is located at a device under test 40. The switch element 5 is part of the signal path 35. The automated test equipment 30, which comprises an instrument 70, forms a signal 45 using a AC and/or DC current. The switch circuit 5 blocks the signal 45 from the device under test 40 if the first switch element 10 and the second switch element 15 are opened, or it allows the signal 45 to pass the switch circuit 5 to the device under test 40 if the first and the second switch element 10, 15 are closed.

Furthermore, the automated test equipment 30 may comprise a switch 50 and a phase measurement unit 55. If the switch 50 is closed, the phase measurement unit 55 is able to perform measurements on the device under test 40. For measurements in an idle mode of the device under test 40, it is advantageous that the second switch element 15 has a large inner resistance in order to enable reliable measurements of the device under test 40. As a side information, the dashed line 60 indicates the instrument boundary, where the automatic test equipment 30 is on the left hand side and the device under test 40 is on the right hand side.

Figure 3:
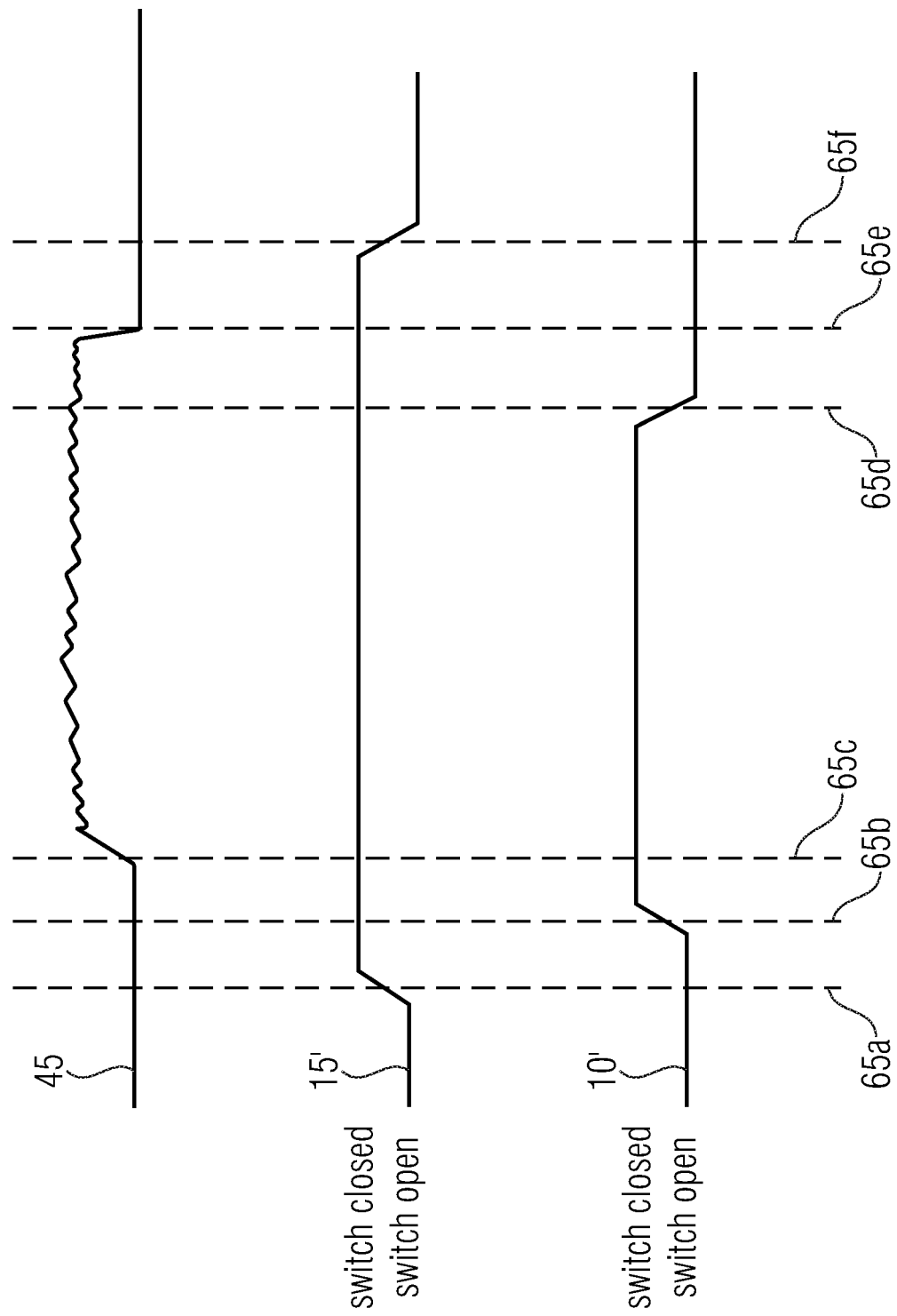
FIG. 3 shows a schematic timing diagram of a first switch element, a second switch element, and an analog signal flow through the first and the second switch element.

FIG. 3 shows a schematic timing diagram with a switch control sequences 10' for the first switch element 10 and a switch control sequences 15' for the second switch element 15. Additionally, an exemplary wave form of the signal 45 is presented as well. The switch control sequence 15' for the MEMS switch 15 closes prior and opens after the semiconductor switch 10. This sequence ensures that the current flow 45 through the MEMS device 15 is very much limited by the closed semiconductor switch 10 at the switching time 65a. As a result, the hot switching stress for the MEMS device 15 is severely reduced. In other words, the switch control timing is used to ensure the desired behavior, e.g., in case of serial switches, the sequence can be used to reduce hot-switching during switch turn-on as well as during turn-off or can allow glitch less switching. When both switches 10, 15 are open, the leakage is limited by the MEMS 15 and no longer by the photo MOS 10. The usage of multiple switch elements forming a single switch and the proper control timing of the switching sequence allows generating a switching solution which can combine the strength of the individual switches. The embodiment with a photo MOS and a MEMS device has been built as a hardware prototype in the lab. Tests with a mix of AC+DC signals switching has been performed successfully. The configuration of the switch elements reduces the current flow through the second switch at the moment of switching and such enhances the lifetime of MEMS switches significantly. This setup was operated for more than 200 million cycles successfully. The same test condition has caused very fast damages and limited lifetime for the MEMS device stand-alone.

Furthermore, FIG. 3 shows the timings 65a to 65f illustrating the previously described timing. It is shown that the second switch element 15 closes 65a prior to the first switch element 10 65b enabling the signal flow 45 65c. Next, the first switch element 10 opens 65d prior to the second switch element 15 65f. In between, the signal flow 45 is stored 65e due to opening the first switch element 10.

FIG. 4 shows a schematic block diagram of a method 400 for operating a switch circuit comprising a first switch element and a second switch element which are connected in series. The method 400 comprises the step 405 providing control signals for switching the first and the second switch element, such that the control signals comprise a different timing and such that the first and the second switch element perform one joint switch function. The method 400 may be implemented in a computer program for performing the method on a computer.

Depending on certain implementation requirements, embodiments of the invention can be implemented in hardware or in software. The implementation can be performed, using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non transitory.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A switch circuit, comprising:
at least a first switch element and a second switch element coupled in series, wherein the second switch element is downstream of the first switch element and the second switch element comprises a better isolation property relative to the first switch element, wherein an electrical current is received by the first switch element and when in a closed state the first switch element allows the current to flow downstream directly to the second switch element; and
a switch control configured to provide a first control signal and a second control signal to switch the first switch element and the second switch element, respectively, wherein the first control signal is operable to switch a state of the first switch element at a different time relative to a time at which the second control signal is operable to switch a state of the second switch element, wherein the first switch element, the second switch element and switch control are configured to participate in a joint switch operation in which:
the second switch element is closed prior to the first switch element if the first
and the second switch elements are open, and
the second switch element is opened after the first switch element if the first and
the second switch elements are closed.

2. An automated test equipment comprising:
a signal path between a device under test connection and an instrument; and
a switch positioned in the signal path, wherein the switch comprises:
a first switch element and a second switch element coupled in series along a direct portion of the signal path without a parallel branch in between the first switch element and second switch element, wherein the second switch element comprises a better isolation property relative to the first switch element and the first switch element is upstream of the second switch element, wherein an electrical current is received by the first switch element and when in a closed state the first switch element allows the current to flow downstream directly to the second switch element; and
a switch control operable to provide a first control signal and a second control signal to switch the first switch element and the second switch element, respectively.

3. The automated test equipment according to claim 2, wherein the second switch element comprises a different switch type relative to the first switch element, wherein the first switch element and second switch element perform a joint switch function and the first control signal is operable to switch a state of the first switch element at a different time relative to a time at which the second control signal is operable to switch a state of the second switch element.

4. The automated test equipment according to claim 2, further comprising:
a third switch coupled to the signal path; and
a phase measurement circuit coupled to the third switch, the phase measurement circuit operable to perform measurements on the device under test.

5. A switch circuit, comprising:
a plurality of switch elements that perform a joint switch function, wherein the plurality of switch elements includes a first switch element and second switch element, wherein the first switch element is more upstream than others of the plurality of switch elements with less robust hot switching characteristics than the first switch element, including wherein the first switch element is more upstream and has more robust hot switching characteristics than the second switch element, wherein an electrical current is received by the first switch element and when in a closed state the first switch element allows the current to flow downstream directly to the second switch element; and
a switch control configured to provide a first control signal and a second control signal to switch the first switch element and the second switch element, respectively, wherein the first control signal is operable to switch a state of the first switch element at a different time relative to a time at which the second control signal is operable to switch a state of the second switch element.

6. The switch circuit according to claim 5, wherein the second switch element comprises a different switch type relative to the first switch element, and wherein the first and second switch elements together operate as a switch.

7. The switch circuit according to claim 5, wherein the first switch element is configured for robustly hot-switching an analogue signal as part of testing operations.

8. The switch circuit according to claim 5, wherein the first switch element is a metal oxide semiconductor (MOS) switch.

9. The switch circuit according to claim 5, wherein the first switch element is a Photo MOS switch.

10. The switch circuit according to claim 5, wherein the second switch element is a microelectromechanical (MEMS) switch.

11. The switch circuit according to claim 5, wherein the switch control is configured to close the second switch element prior to the first switch element if the first switch element and the second switch elements are open.

12. The switch circuit according to claim 5, wherein the switch control is configured to open the second switch element after the first switch element if the first switch element and the second switch elements are closed.

13. The switch circuit according to claim 5, wherein the switch control is configured to switch the first switch element to control a current flow through the second switch element and the switch circuit is included in automated test equipment.

14. A method for operating a switch circuit, the method comprising:
switching a state of a first switch element in accordance with first control signal; and
switching a state of a second switch element at a different time than the switching of the state of the first element in accordance with a second control signal; including opening the second switch element after the first switch element if the first switch element and the second switch elements are closed, including wherein the first switch element is more upstream and has more robust hot switching characteristics than the second switch element, wherein an electrical current is received by the first switch element and when in a closed state the first switch element allows the current to flow downstream directly to the second switch element.

15. The method according to claim 14, wherein the switching the state of the first switch element and switching the state of the second switch element are part of executing a joint switch function.

16. The method according to claim 14, wherein switching the state of the second switch element includes closing the second switch element prior to the first switch element if the first switch element and the second switch elements are opened.

17. The method according to claim 14 wherein switching the state of the second switch element includes closing the second switch element after the first switch element in operations to close the first switch element and the second switch elements.

18. A switch circuit, comprising:
   at least a first switch element configured to switch between an open switch state and a closed switch state that are part of a joint switch function; and
   at least a second switch element configured to switch between an open switch state and a closed switch state that are part of the joint switch function,
   wherein a state of the first switch element switches at a different time relative to a time at which the state of the second switch element switches,
   wherein the first switch element and the second switch element are coupled in series along a portion of the signal path without a parallel branch in between the first switch element and second switch element, wherein the first switch element is upstream of the second switch element, wherein an electrical current is received by the first switch element and when in a closed state the first switch element allows the current to flow downstream directly to the second switch element, wherein the first switch element comprises a different switch type relative to the second switch element wherein:
   the first switch element has robust hot switching characteristics compared to the second switch element, and
   the second switch element has better isolation characteristics compared to the first switch element.

19. A non-transitory digital storage medium having a computer program stored thereon, including instructions that when implemented by a processing component direct switch function operations comprising:
   generating a first control signal that controls a first switch component and a second control signal that controls a second switch component, wherein the first control signal and the second control signal control execution of a joint switch function by the first switch component and second switch element, wherein the first switch component and second switch component are coupled in series, wherein the first switch element is more upstream and has more robust hot switching characteristics than the second switch element, wherein an electrical current is received by the first switch element and when in a closed state the first switch element allows the current to flow downstream directly to the second switch element; and
   providing the first control signal to the first switch component and the second control signal to the second switch component, respectively, and wherein the first control signal is operable to switch a state of the first switch component at a different time relative to a time at which the second control signal is operable to switch a state of the second switch component, wherein the second switch component comprises a different switch type relative to the first switch component.

\* \* \* \* \*